United States Patent
Tu et al.

(10) Patent No.: US 8,828,777 B2
(45) Date of Patent: *Sep. 9, 2014

(54) WAFER LEVEL IMAGE SENSOR PACKAGING STRUCTURE AND MANUFACTURING METHOD OF THE SAME

(75) Inventors: Hsiu-Wen Tu, Hsin-Chu Hsien (TW); Chung-Hsien Hsin, Hsin-Chu Hsien (TW); Han-Hsing Chen, Hsin-Chu Hsien (TW); Ming-Hui Chen, Hsin-Chu Hsien (TW); Ren-Long Kuo, Hsin-Chu Hsien (TW); Chih-Cheng Hsu, Hsin-Chu Hsien (TW); Young-Houng Shiao, Hsin-Chu Hsien (TW); Tsao-Pin Chen, Hsin-Chu Hsien (TW)

(73) Assignee: Kingpak Technology Inc., Hsin-Chu Hsien (TW)

( * ) Notice: Subject to any disclaimer, the term of this patent is extended or adjusted under 35 U.S.C. 154(b) by 843 days.

This patent is subject to a terminal disclaimer.

(21) Appl. No.: 13/012,967

(22) Filed: Jan. 25, 2011

(65) Prior Publication Data

US 2011/0241147 A1    Oct. 6, 2011

Related U.S. Application Data

(60) Provisional application No. 61/321,217, filed on Apr. 6, 2010, provisional application No. 61/334,254, filed on May 13, 2010.

(51) Int. Cl.
*H01L 21/52* (2006.01)
*H01L 21/56* (2006.01)
*H01L 27/146* (2006.01)

(52) U.S. Cl.
CPC .... *H01L 27/14618* (2013.01); *H01L 27/14683* (2013.01); *H01L 27/14687* (2013.01)
USPC ............................................. 438/65; 257/432

(58) Field of Classification Search
CPC ................... H01L 27/14618; H01L 27/14625; H01L 27/14683; H01L 21/6835; H01L 2221/6834; H01L 2221/68377; H01L 24/94
USPC ..................................... 257/432–434; 438/65
See application file for complete search history.

(56) References Cited

U.S. PATENT DOCUMENTS

| 8,189,277 B2 * | 5/2012 | Kintz et al. .................... 359/797 |
| 2011/0204462 A1 * | 8/2011 | Borthakur et al. ............. 257/432 |
| 2011/0279815 A1 * | 11/2011 | Tu et al. ......................... 356/213 |

* cited by examiner

*Primary Examiner* — Ha Tran T Nguyen
*Assistant Examiner* — Raj R Gupta
(74) *Attorney, Agent, or Firm* — Juan Carlos A. Marquez; Bacon & Thomas, PLLC

(57) ABSTRACT

The present invention discloses a wafer level image sensor packaging structure and a manufacturing method of the same. The manufacturing method includes the following steps: providing a silicon wafer, dicing the silicon wafer, providing a plurality of transparent lids, fabricating a plurality of semi-finished products, performing a packaging process, mounting solder balls, and cutting an encapsulant between the semi-finished products. The manufacturing method of the invention has the advantage of being straightforward, uncomplicated, and cost-saving. Thus, the wafer level image sensor package structure is lightweight, thin, and compact. To prevent the image sensor chip from cracking on impact during handling, the encapsulant will be arranged on the lateral sides of the semi-finished products during the packaging process.

16 Claims, 23 Drawing Sheets

US 8,828,777 B2

WAFER LEVEL IMAGE SENSOR PACKAGING STRUCTURE AND MANUFACTURING METHOD OF THE SAME

BACKGROUND OF THE INVENTION

1. Field of the Invention

The present invention relates to wafer level image sensor packaging structures and manufacturing methods of the same, and more particularly, to a wafer level image sensor packaging structure and a manufacturing method of the same applicable to batch fabrication of the image sensor packaging structure.

2. Description of Related Art

In recent years, digital imaging electronic products are becoming more popular. Camera cell phones, digital cameras, and digital video recorders have evolved into such a generation that they have become indispensable to every person. Given the increasing demand for imaging electronic products, it is easy to conceive the rapid speed at which the image sensor market expands.

Among the conventional methods for packaging image sensors are two predominant ones, namely Chip On Board (COB) and Chip Scale Package (CSP). In COB, an image sensing chip is adhesively attached to a substrate, and then the image sensing chip is electrically connected to the substrate by means of metal wires. As a result, the image sensor packaging structure is of a relatively large size and a considerable height when packaged. In addition, during the COB packaging period, the image sensor packaging structure is susceptible to dust intrusion or moisture permeation and thus likely to have a low conforming rate. Hence, COB has a high demand for a cleanroom that must be highly clean. As a result, COB incurs high process costs.

CSP is qualified as package scale with its length no greater than 1.2 times and its area no greater than 1.44 times that of the bare die by visual inspection. Hence, compared to COB, a packaging structure combining chip scale package with chip level package can leave out substrates and metal wires thereof, so as to cut the cost of packages and go with the trend of compact size electronic products nowadays.

However, conventional wafer level image sensor packaging structures have a drawback, that is, the image sensing chip is thin and thus likely to crack, which is particularly the case where, upon completion of a packaging process, all the lateral sides of the image sensing chip are exposed and thus more likely to be hit during a back-end process for assembling an image sensor, thereby resulting in a decrease of the product conforming rate.

SUMMARY OF THE INVENTION

The present invention relates to a wafer level image sensor packaging structure and a manufacturing method wherein a through-silicon vias (TSV) wafer is used as a silicon wafer. Hence, compared with a conventional COB process, the wafer level image sensor packaging structure and the manufacturing method of the present invention dispense with materials, such as metal wires and substrates, cut packaging costs, and streamline a process in its entirety.

The present invention relates to a wafer level image sensor packaging structure and a manufacturing method whereby an encapsulant covers the lateral sides of the packaging structure and thereby prevents light leakage from the sides of the wafer level image sensor packaging structure. The encapsulant also extend to encapsulate an image sensing chip to thereby reinforce the wafer level image sensor packaging structure and prevent the image sensing chip from cracking which might otherwise arise from excessive thinness of the image sensing chip.

The present invention relates to a wafer level image sensor packaging structure and a manufacturing method whereby, before a packaging process, image sensing chips are screened for being in conformity with quality requirements, and transparent lids are arranged correspondingly above high-grade image sensing chips, so as to reduce a waste of materials and increase the conforming rate.

In order to achieve the above and other objectives, the present invention provides a wafer level image sensor packaging structure manufacturing method, comprising the steps of: providing a silicon wafer comprising a plurality of image sensing chips, the image sensing chips each comprising an image sensing region and a plurality of soldering pads; dicing the silicon wafer such that the silicon wafer is divided into the image sensing chips; providing a plurality of transparent lids by cutting at least one transparent panel; fabricating a plurality of semi-finished products each having the transparent lid disposed above the image sensing region of the image sensing chip, wherein a air cavity is formed between the transparent lid and the image sensing region; performing a packaging process by filling an encapsulant between the semi-finished products such that the encapsulant only covers the lateral sides of each of the semi-finished products; mounting solder balls on the soldering pads; and cutting the encapsulant between the semi-finished products.

In order to achieve the above and other objectives, the present invention further provides a wafer level image sensor packaging structure, comprising a semi-finished product, a plurality of solder balls, and an encapsulant. The semi-finished product comprises: an image sensing chip comprising an image sensing region and a plurality of soldering pads, wherein the image sensing region and the soldering pads are disposed on opposing surfaces of the image sensing chip; and a transparent lid being disposed above the image sensing region of the image sensing chip and corresponding in position thereto, wherein a air cavity is formed between the transparent lid and the image sensing region. The plurality of solder balls are mounted on the soldering pads, respectively. The encapsulant is disposed along a periphery of the semi-finished products.

Implementation of the present invention at least involves the following inventive steps:

1. Compared with a conventional COB process, the process of the manufacturing method of the present invention is simplified and effective in dispensing with materials and reducing the height of the package structure. Thus, a wafer level image sensor package structure thus fabricated is lightweight, thin, and compact, and incurs less fabrication costs.

2. An encapsulant which is disposed along the periphery of the packaging structure not only prevents light leakage from the sides of the wafer level image sensor packaging structure but also protects the image sensing chip properly by preventing the image sensing chip from cracking due to excessive thinness thereof, thereby enhancing the reliability of the packaging structure.

3. High-grade image sensing chips are selected for a subsequent packaging process, so as to increase the conforming rate and avoid a waste of materials.

BRIEF DESCRIPTION OF THE DRAWINGS

A detailed description of further features and advantages of the present invention is given below so that a person skilled in the art can understand and implement the technical contents of the present invention and readily comprehend the objectives, features, and advantages thereof by reviewing the disclosure of the present specification and the appended claims in conjunction with the accompanying drawings, in which:

DETAILED DESCRIPTION OF THE INVENTION

Figure 1A:
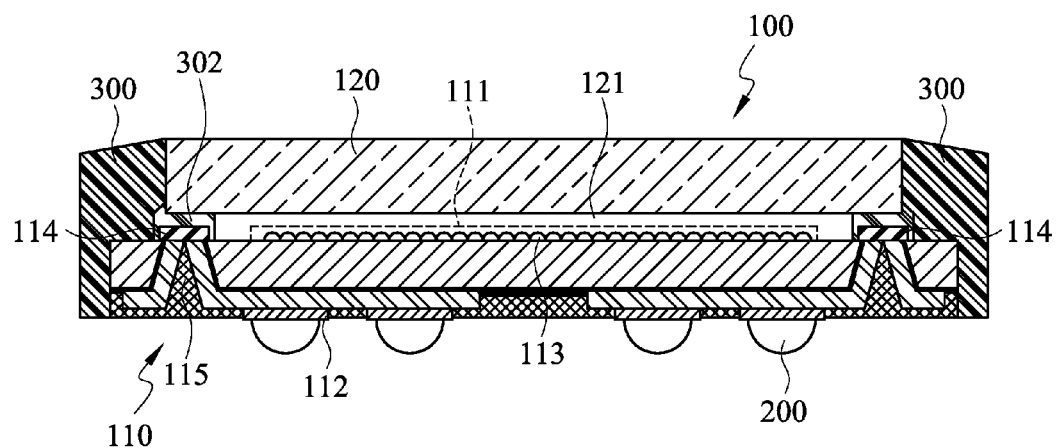
FIG. 1A through FIG. 2B are schematic views of a wafer level image sensor packaging structure according to an embodiment of the present invention.
Figure 1B:
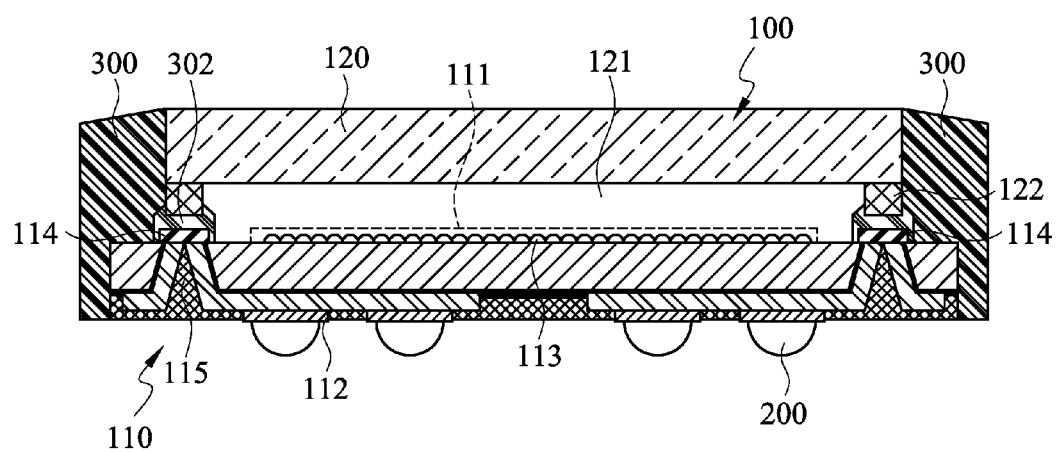
Figure 2A:
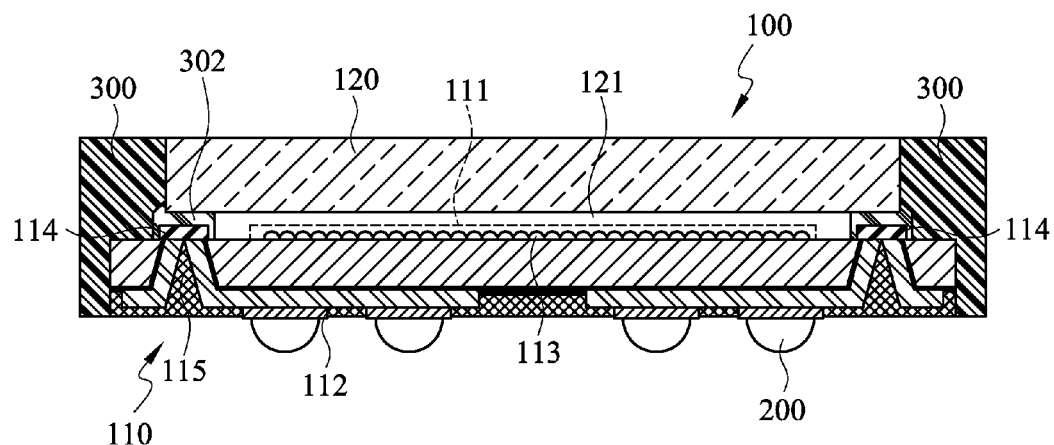
Figure 2B:
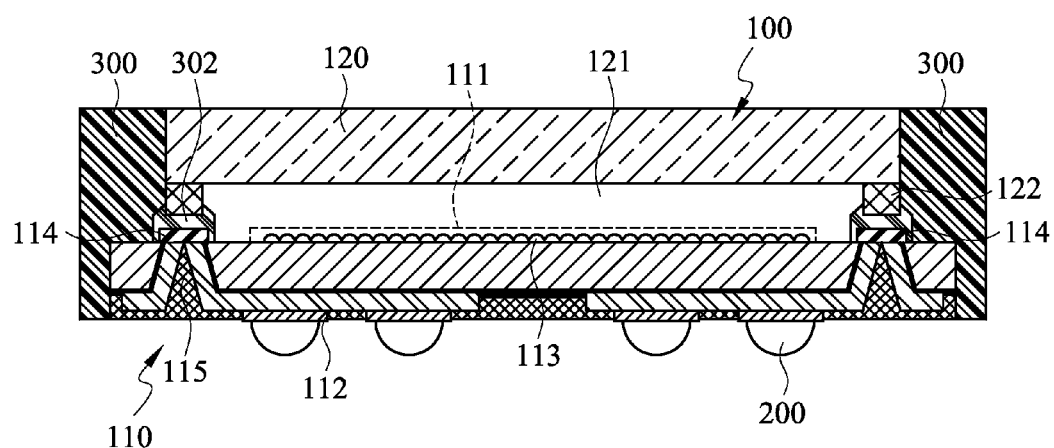
Figure 3:
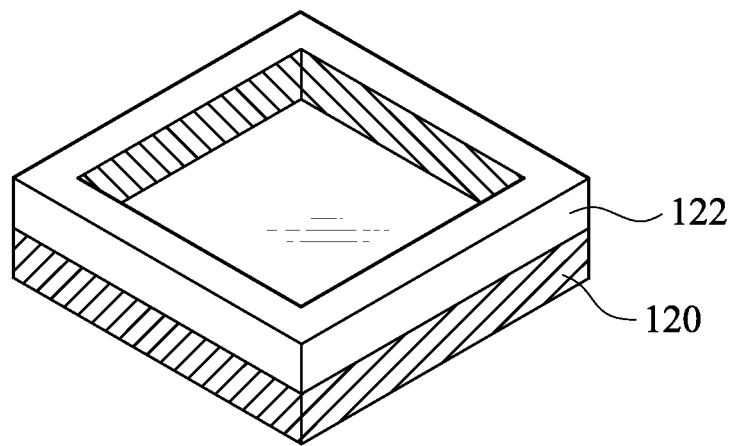
FIG. 3 is a schematic perspective view of a transparent lid with a supporting frame thereon according to an embodiment of the present invention.

Referring to FIG. 1A through FIG. 2B, there are shown schematic views of a wafer level image sensor packaging structure according to an embodiment of the present invention. Referring to FIG. 3, there is shown a schematic perspective view of a transparent lid 120 with a supporting frame 122 thereon according to an embodiment of the present invention.

Figure 4:
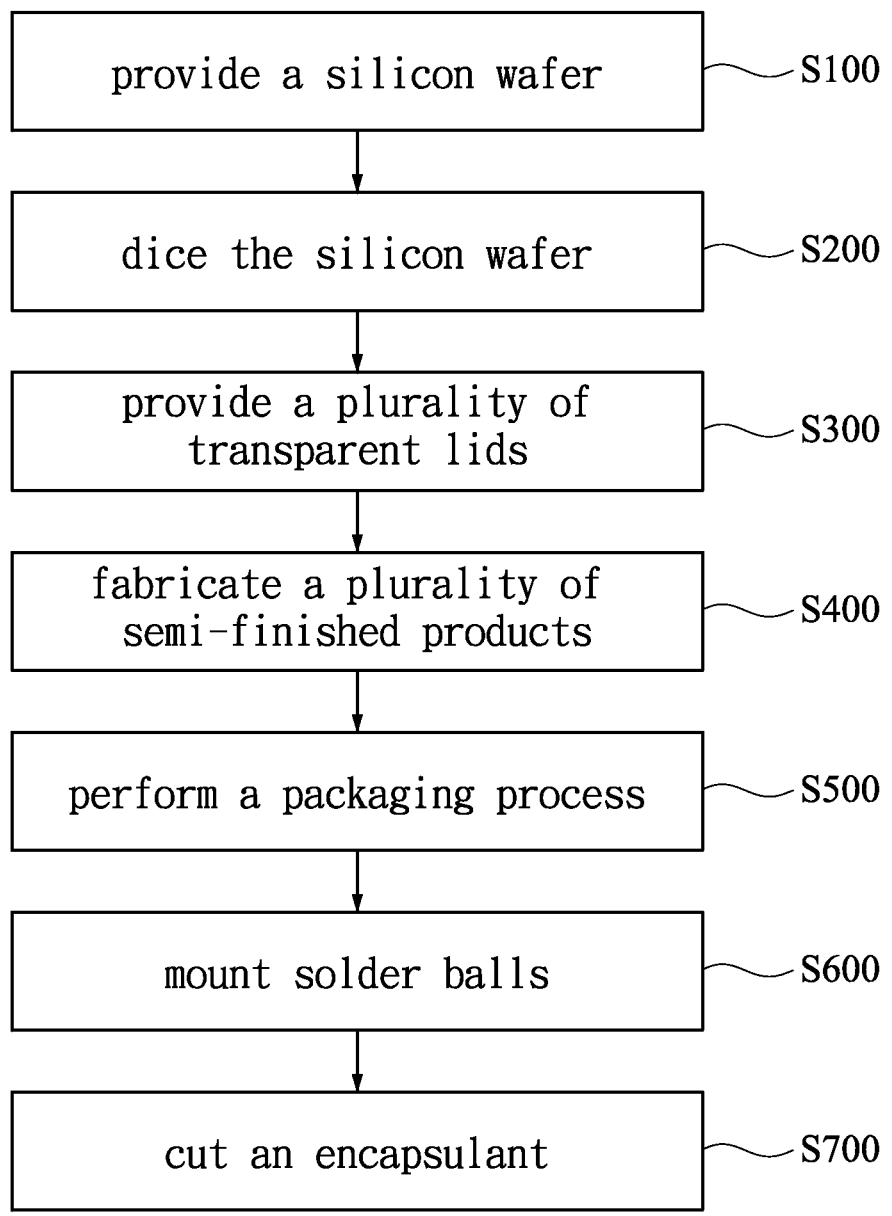
FIG. 4 is a flow chart of a wafer level image sensor packaging structure manufacturing method according to an embodiment of the present invention.
Figure 5:
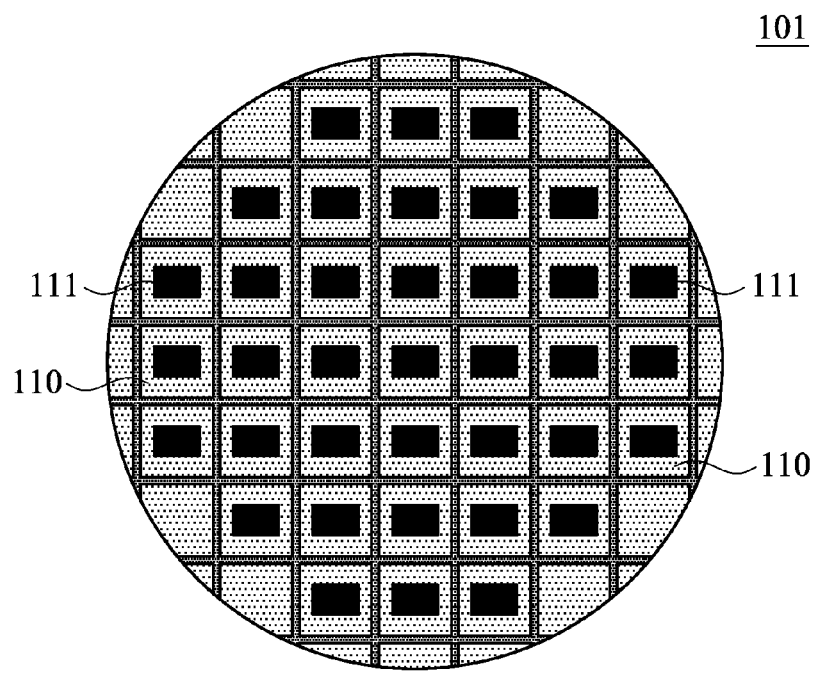
FIG. 5 is a schematic view of a silicon wafer having image sensing chips according to an embodiment of the present invention.
Figure 6:
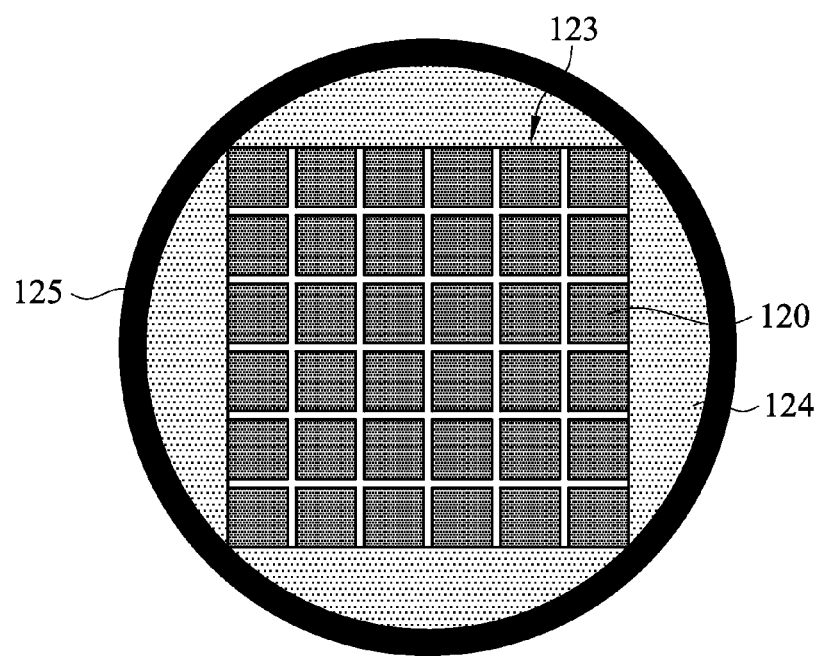
FIG. 6 is a schematic view of a transparent panel according to an embodiment of the present invention.
Figure 7:
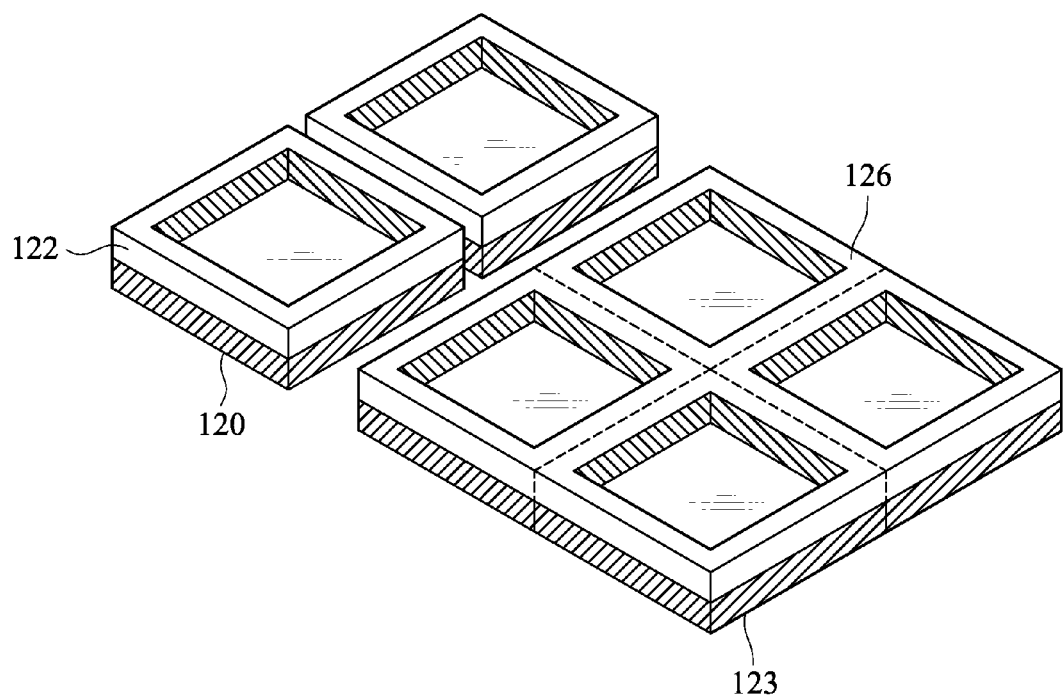
FIG. 7 is a schematic perspective view of a transparent lid with a gridded frame thereon according to an embodiment of the present invention.

Referring to FIG. 4, there is shown a flow chart of a wafer level image sensor packaging structure manufacturing method according to an embodiment of the present invention. Referring to FIG. 5, there is shown a schematic view of a silicon wafer 101 having image sensing chips 110 according to an embodiment of the present invention. Referring to FIG. 6, there is shown a schematic view of a transparent panel 123 according to an embodiment of the present invention. Referring to FIG. 7, there is shown a schematic perspective view of a transparent lid 120 with a gridded frame thereon according to an embodiment of the present invention.

Figure 8A:
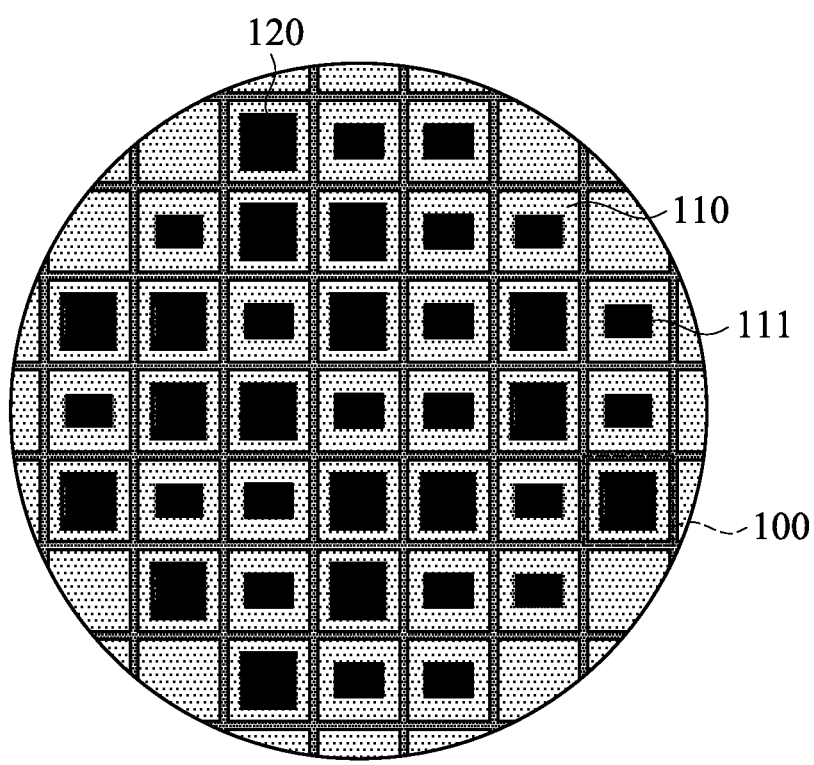
FIG. 8A is a schematic top view of a silicon wafer having transparent lids according to an embodiment of the present invention.
Figure 8B:
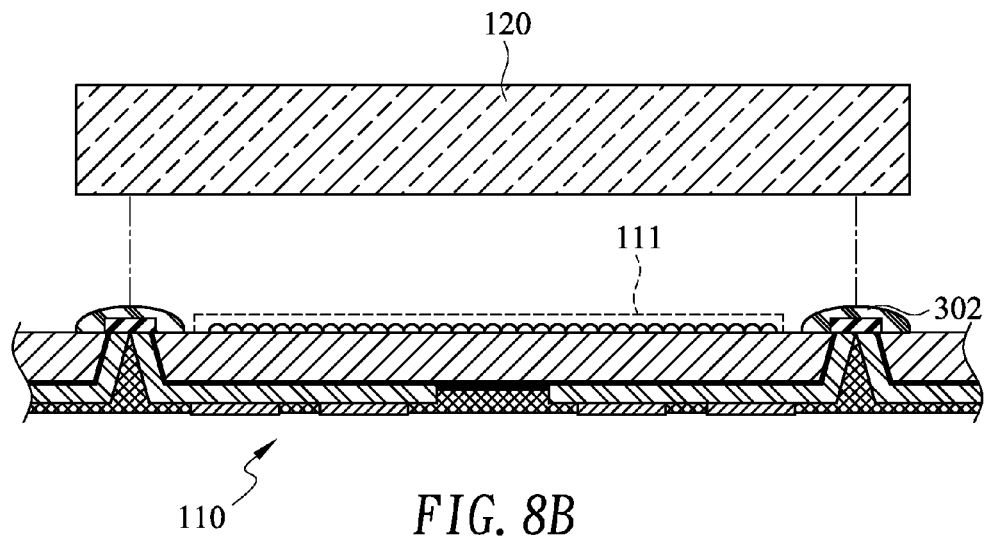
FIG. 8B is a schematic view of a transparent lid correspondingly attached to an image sensing chip according to an embodiment of the present invention.
Figure 8C:
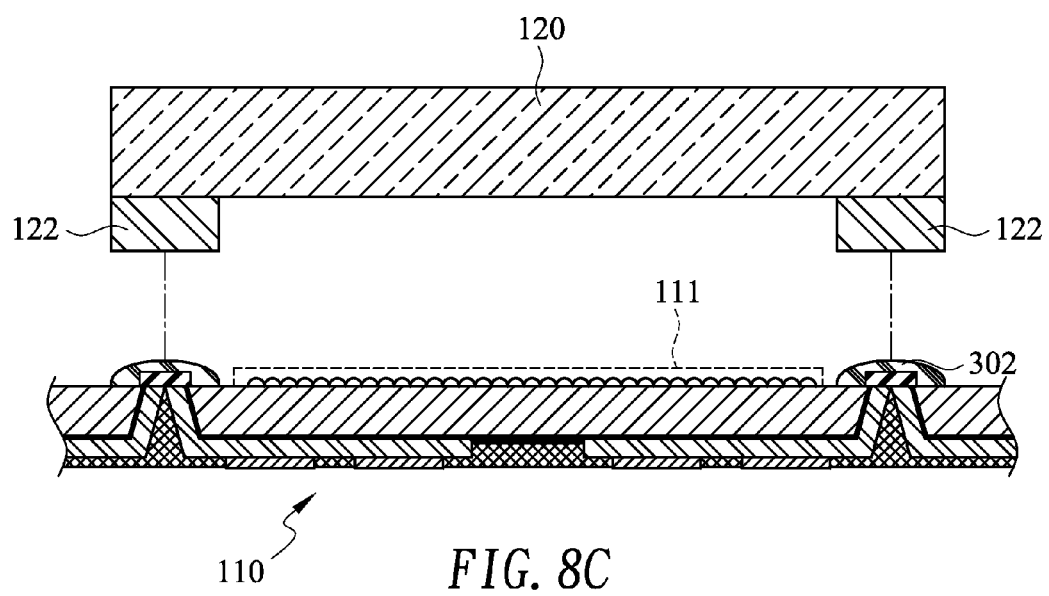
FIG. 8C is a schematic view of another transparent lid correspondingly attached to an image sensing chip according to an embodiment of the present invention.

Referring to FIG. 8A, there is shown a schematic top view of the silicon wafer 101 having the transparent lid 120 according to an embodiment of the present invention. Referring to FIG. 8B, there is shown a schematic view of the transparent lid 120 corresponding in position to and attached to the image sensing chip 110 according to an embodiment of the present invention. Referring to FIG. 8C, there is shown a schematic view of another transparent lid 120 corresponding in position to and attached to the image sensing chip 110 according to an embodiment of the present invention.

Referring to FIG. 1A, FIG. 1B, FIG. 2A, and FIG. 2B, in this embodiment, a wafer level image sensor packaging structure comprises a plurality of semi-finished products 100, a plurality of solder balls 200, and an encapsulant 300. The semi-finished products 100 comprise the image sensing chip 110 and the transparent lid 120.

The image sensing chip 110 comprises an image sensing region 111 and a plurality of soldering pads 112. The image sensing region 111 and the soldering pads 112 are on the upper surface and the lower surface of the image sensing chip 110, respectively, and thus the image sensing region 111 and the soldering pads 112 face opposite directions. A plurality of photosensitive elements 113 is disposed at the image sensing region 111 to fully occupy the area thereof. The photosensitive elements 113 disposed at the image sensing region 111 are arranged in an array and configured to sense light. Also, the image sensing chip 110 has vias therein. A plurality of conductive channels 115 is disposed in the vias, respectively. The conductive channels 115 are circuit structures that penetrate the image sensing chip 110. The circuit structures extend to the lower surface of the image sensing chip 110 through a re-distribution layer.

Furthermore, a plurality of conductive contacts 114 is disposed on the upper surface of the image sensing chip 110 in a manner to surround the image sensing region 111 by lining up along the boundary thereof, and is electrically connected to the photosensitive elements 113 and the conductive channels 115. Hence, it is through the conductive contacts 114 that the photosensitive elements 113 are electrically connected to the conductive channels 115 and then electrically connected to the soldering pads 112, respectively.

The solder balls 200 are mounted on the soldering pads 112. The solder balls 200 are arranged in the form of a ball grid array (BGA). The solder balls 200 are not only electrically connected to the soldering pads 112 but also electrically connected to the conductive channels 115 of the image sensing chip 110 through the soldering pads 112. Hence, the solder balls 200 function as an electrical connection interface between the wafer level image sensor packaging structure and an external device (not shown).

The transparent lid 120 is correspondingly disposed above the image sensing region 111 of the image sensing chip 110. Referring to FIG. 8B too, the transparent lid 120 is aligned with and attached to the outer side of the image sensing region 111, such that a air cavity 121 is formed between the transparent lid 120 and the image sensing region 111. As shown in FIG. 3, the transparent lid 120 is further provided with the supporting frame 122 thereon, and the supporting frame 122 is disposed along the periphery of the transparent lid 120, so as for an opening to be formed at the center of the transparent lid 120. As shown in FIG. 8C, the transparent lid 120 with the supporting frame 122 thereon is adhesively attached to the image sensing chip 110 by the supporting frame 122 in a manner that the supporting frame 122 surrounds the image sensing region 111.

The encapsulant 300 is disposed along the periphery of the semi-finished products 100; in other words, the encapsulant 300 encloses the semi-finished products 100. Hence, the encapsulant 300 prevents the image sensing chip 110 from cracking which might otherwise arise from excessive thinness of the image sensing chip 110. The encapsulant 300 comes in different forms, such as a mold compound or a liquid compound, depending on a packaging process.

The liquid compound is fit for use in a dispensing-based packaging process, and the encapsulant 300 thus formed tapers slightly (as shown in FIG. 1A and FIG. 1B). The mold compound is fit for use in a molding-based packaging process, and the encapsulant 300 thus formed does not taper (as shown in FIG. 2A and FIG. 2B). Also, the encapsulant 300 can be plastics of a low transmittance (such as black plastics) for preventing light leakage from the sides which might otherwise take place during a process of fabricating the wafer level image sensor packaging structure.

Referring to FIG. 4, there is shown a flow chart of a wafer level image sensor packaging structure manufacturing method according to an embodiment of the present invention. As shown in the drawing, the wafer level image sensor packaging structure manufacturing method comprises the steps of: providing a silicon wafer (S100); dicing the silicon wafer (S200); providing a plurality of transparent lids (S300); fabricating a plurality of semi-finished products (S400); performing a packaging process (S500); mounting a plurality of solder balls (S600); and cutting an encapsulant (S700).

The step of providing a silicon wafer (S100) is described hereunder. As shown in FIG. 5, the silicon wafer 101 is a through-silicon vias (TSV) wafer, and the silicon wafer 101 comprises a plurality of image sensing chips 110. As shown in FIG. 1A, the image sensing chips 110 each comprise one said image sensing region 111 and a plurality of the soldering pads 112. The image sensing region 111 and the soldering pads 112 are defined and disposed on opposing sides of the image sensing chips 110, respectively; in other words, the image sensing region 111 is defined on the upper surface of the image sensing chips 110, and the soldering pads 112 are disposed on the lower surface of the image sensing chips 110.

The step of dicing the silicon wafer (S200) is described hereunder. The silicon wafer 101 is diced such that the silicon wafer 101 is divided into a plurality of said image sensing chips 110.

The step of providing a plurality of transparent lids (S300) is described hereunder. As shown in FIG. 6, the transparent lids 120 are forming by cutting at least one transparent panel 123. The transparent panel 123 is supported by a carrying film 124, and is circumscribed by a frame 125 disposed on the carrying film 124. The frame 125 is conducive to positioning the transparent panel 123 while the transparent panel 123 is being cut during a fabrication process and to transporting the transparent panel 123 during a fabrication process.

Referring to FIG. 7, a gridded frame 126 is formed on the transparent panel 123. The gridded frame 126 is marked with an imaginary cutting line in advance. The transparent panel 123 and the gridded frame 126 thereon are cut along the cutting line to be divided into the transparent lids 120 and a plurality of said supporting frames 122 thereon, respectively. In other words, the gridded frame 126 on the transparent panel 123 is turned into the supporting frames 122 on the transparent lids 120, by cutting the transparent panel 123 and the gridded frame 126 along the cutting line. The gridded frame 126 is fabricated by screen printing, transfer molding, or injection molding. The gridded frame 126 is made of an epoxy.

The step of fabricating a plurality of semi-finished products (S400) is described hereunder. As shown in FIG. 8A, the semi-finished products 100 each comprise one said image sensing chip 110 and one said transparent lid 120. The transparent lid 120 is correspondingly disposed above the image sensing region 111 of the image sensing chip 110. As shown in FIG. 8B, the assembly process flow of the semi-finished products 100 comprises the steps of: coating an adhesive 302 along the periphery of the image sensing region 111; aligning the transparent lid 120 with the adhesive 302 and adhesively attaching the transparent lid 120 to the adhesive 302; and baking or UV-radiation curing the adhesive 302, so as for the transparent lid 120 to be adhesively attached to and fixed to the image sensing chip 110 and for a air cavity 121 (shown in FIG. 1A) to be formed between the transparent lid 120 and the image sensing region 111. Referring to FIG. 8C, the transparent lid 120 with the supporting frame 122 thereon is adhesively attached to the adhesive 302 by the supporting frame 122, such that the supporting frame 122 adheres to the image sensing chip 110 and surrounds the image sensing region 111.

In addition, before the assembly of the semi-finished products 100 begins, the image sensing chips 110 are screened for being in conformity with quality requirements, and then only high-grade ones of image sensing chips 110 are assembled, so as to increase the conforming rate of the wafer level image sensor packaging structure.

The step of performing a packaging process (S500) is described hereunder. The encapsulant 300 is filled between the semi-finished products 100, and the encapsulant 300 only covers the lateral sides of each of the semi-finished products 100. The process flow of the packaging process is hereunder illustrated with two types of packaging processes, namely a molding-based packaging process and a dispensing-based packaging process.

Figure 9:
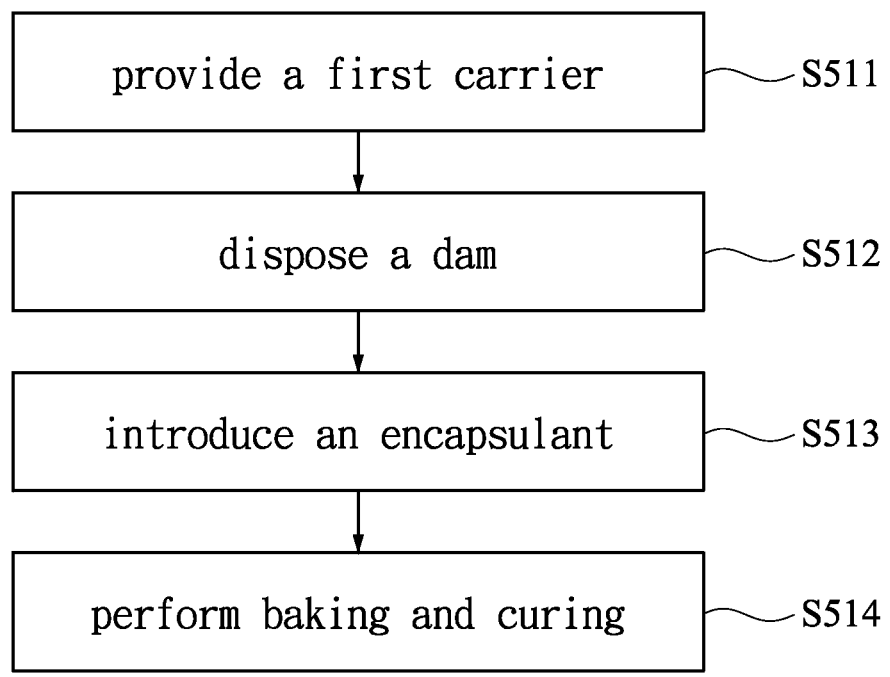
FIG. 9 is a flow chart of a method of a dispensing-based packaging process according to an embodiment of the present invention.
Figure 10A:
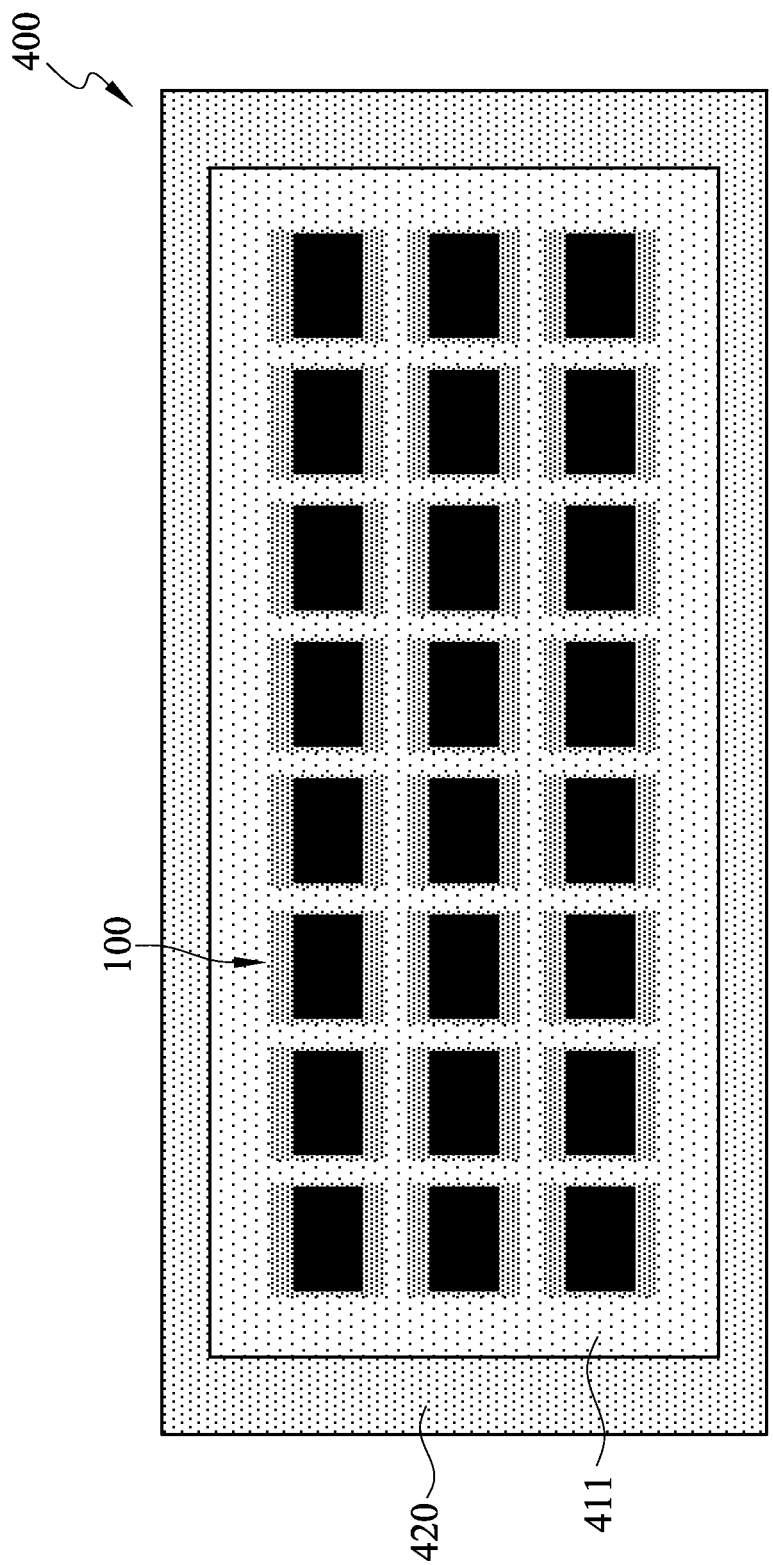
FIG. 10A is a schematic top view of a first carrier with semi-finished products thereon according to an embodiment of the present invention.
Figure 10B:
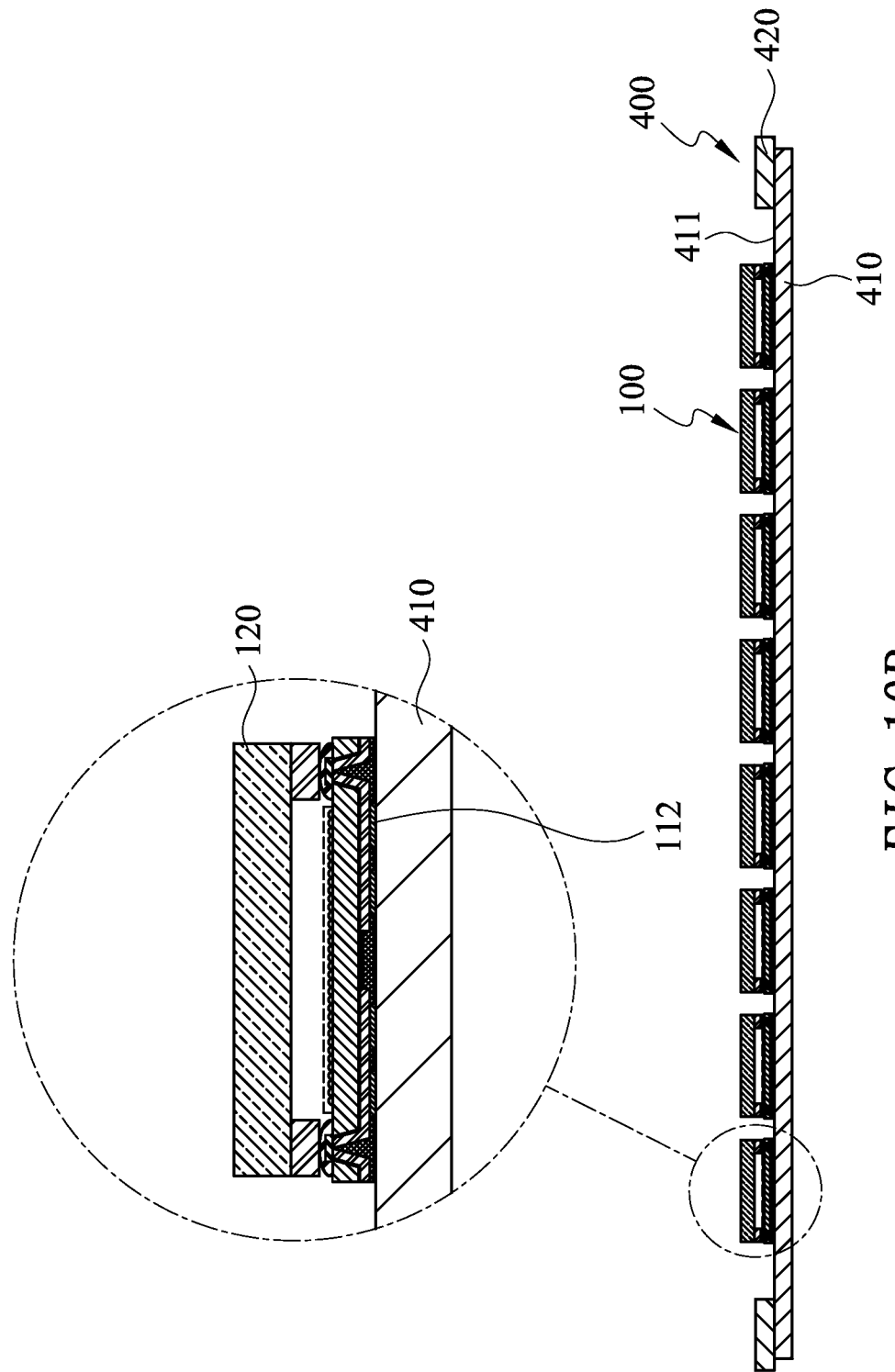
FIG. 10B is a schematic cross-sectional view of the first carrier with semi-finished products thereon according to an embodiment of the present invention.
Figure 11A:
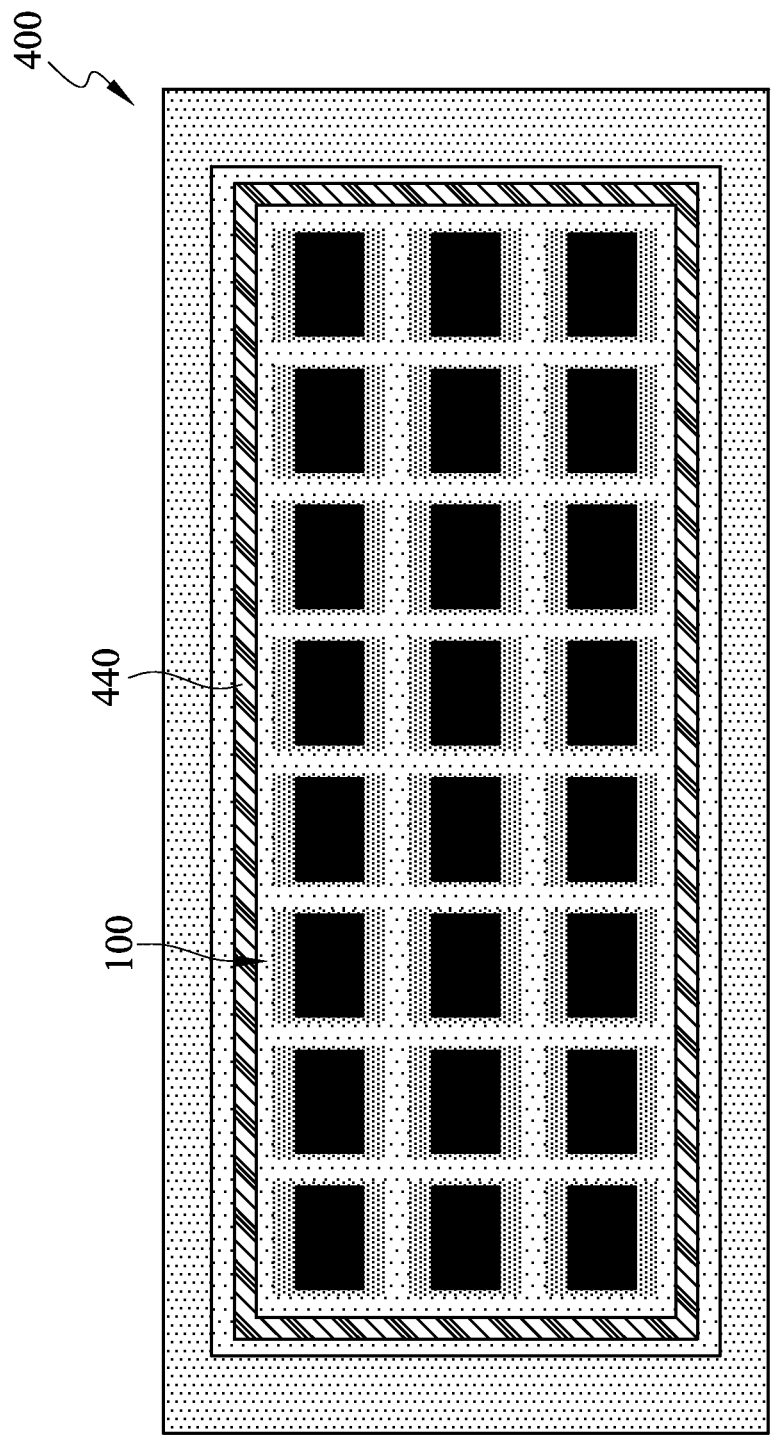
FIG. 11A is a schematic top view of the first carrier and a dam thereon according to an embodiment of the present invention.
Figure 11B:
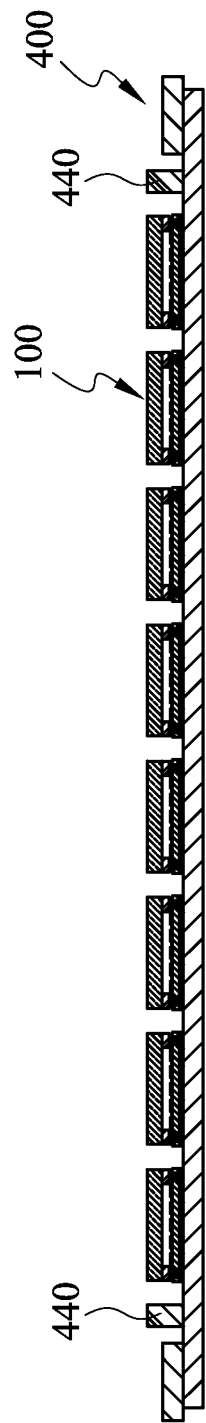
FIG. 11B is a schematic cross-sectional view of the first carrier and a dam thereon according to an embodiment of the present invention.
Figure 12:
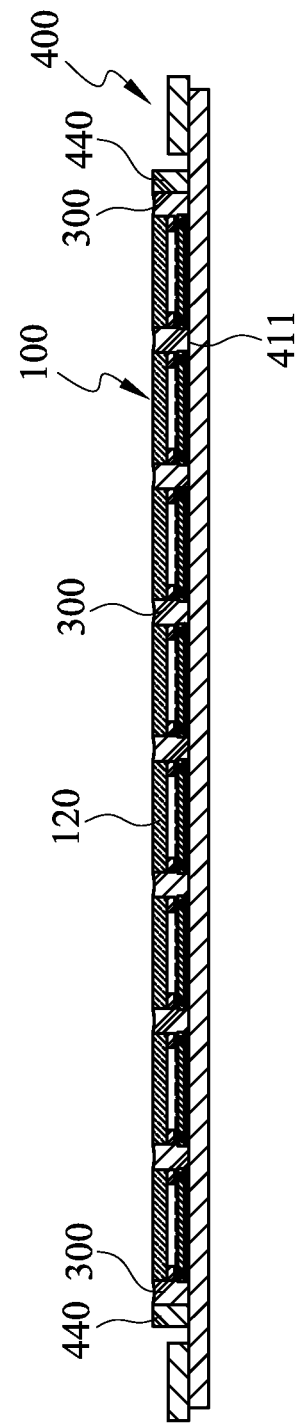
FIG. 12 is a schematic cross-sectional view of a structure fabricated by a dispensing-based packaging process according to an embodiment of the present invention.

Referring to FIG. 9, there is shown a flow chart of a method of a dispensing-based packaging process according to an embodiment of the present invention. Referring to FIG. 10A, there is shown a schematic top view of a first carrier 400 with the semi-finished products 100 thereon according to an embodiment of the present invention. Referring to FIG. 10B, there is shown a schematic cross-sectional view of the first carrier 400 with the semi-finished products 100 thereon according to an embodiment of the present invention. Referring to FIG. 11A, there is shown a schematic top view of the first carrier 400 and a dam 440 thereon according to an embodiment of the present invention. Referring to FIG. 11B, there is shown a schematic cross-sectional view of the first carrier 400 and a dam 440 thereon according to an embodiment of the present invention. Referring to FIG. 12, there is shown a schematic cross-sectional view of a structure fabricated by a dispensing-based packaging process according to an embodiment of the present invention.

Referring to FIG. 9, the dispensing-based packaging process comprises the steps of: providing a first carrier (S511); disposing a dam (S512); introducing an encapsulant (S513); and performing baking and curing (S514).

The step of providing a first carrier (S511) is described hereunder. As shown in FIG. 10A and FIG. 10B, step (S511) entails disposing the semi-finished products 100 on the first carrier 400, wherein the first carrier 400 comprises a first film 410 and a first frame 420. The first film 410 has a first adhesive side 411. The first film 410 is attached to one side of the first frame 420, such that the first adhesive side 411 is exposed from inside the first frame 420 and forms a first carrying region. The semi-finished products 100 are arranged in an array within the first carrying region. The soldering pads 112 of the semi-finished products 100 rest on the first adhesive side 411.

The step of disposing a dam (S512) is described hereunder. As shown in FIG. 11A and FIG. 11B, the dam 440 is disposed on the first carrier 400 by forming a circular structure along the periphery of the first carrier 400 to enclose the semi-finished products 100, such that the semi-finished products 100 are bounded by the dam 440. Furthermore, the dam 440 can be made of an epoxy, and the height of the dam 440 has to be equal to or less than the total height of the semi-finished products 100.

The step of introducing an encapsulant (S513) is described hereunder. As shown in FIG. 12, the encapsulant 300 is a liquid compound and thus can fill whatever space bounded by the dam 440 and between the semi-finished products 100. The height of the dam 440 ensures that the encapsulant 300 can reach the lateral sides of the semi-finished products 100 to cover the lateral sides of the semi-finished products 100, and ensures that surfaces of the semi-finished products 100 (that is, surfaces of the transparent lids 120) can be exposed. Also, the bottom sides (i.e., soldering pad-disposed sides) of the semi-finished products 100 are temporarily adhered to the first adhesive side 411, and thus the encapsulant 300 does not cover the soldering pad-disposed sides of the semi-finished products 100.

The step of performing baking and curing (S514) is described hereunder. A baking and curing process is performed on the encapsulant 300 to cure and shape the encapsulant 300 and finalize the molding process.

Figure 13:
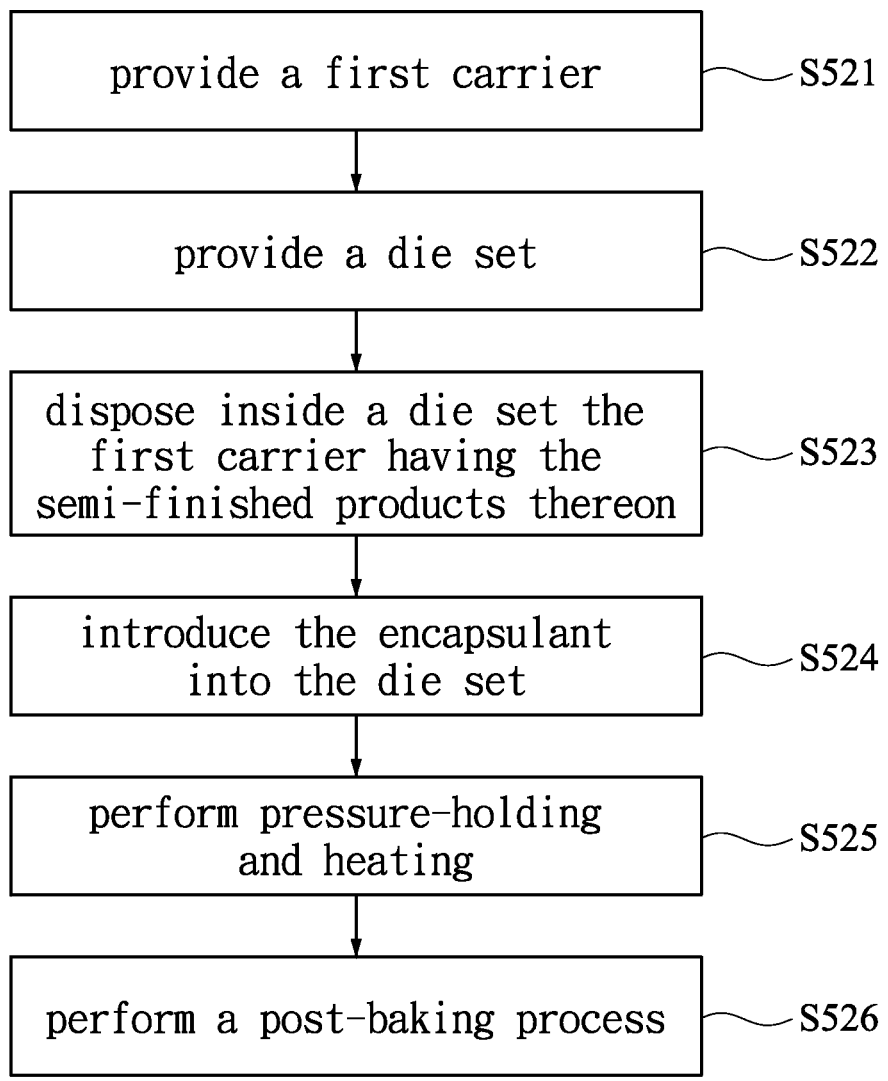
FIG. 13 is a flow chart of a method of the molding-based packaging process according to an embodiment of the present invention.
Figure 14:
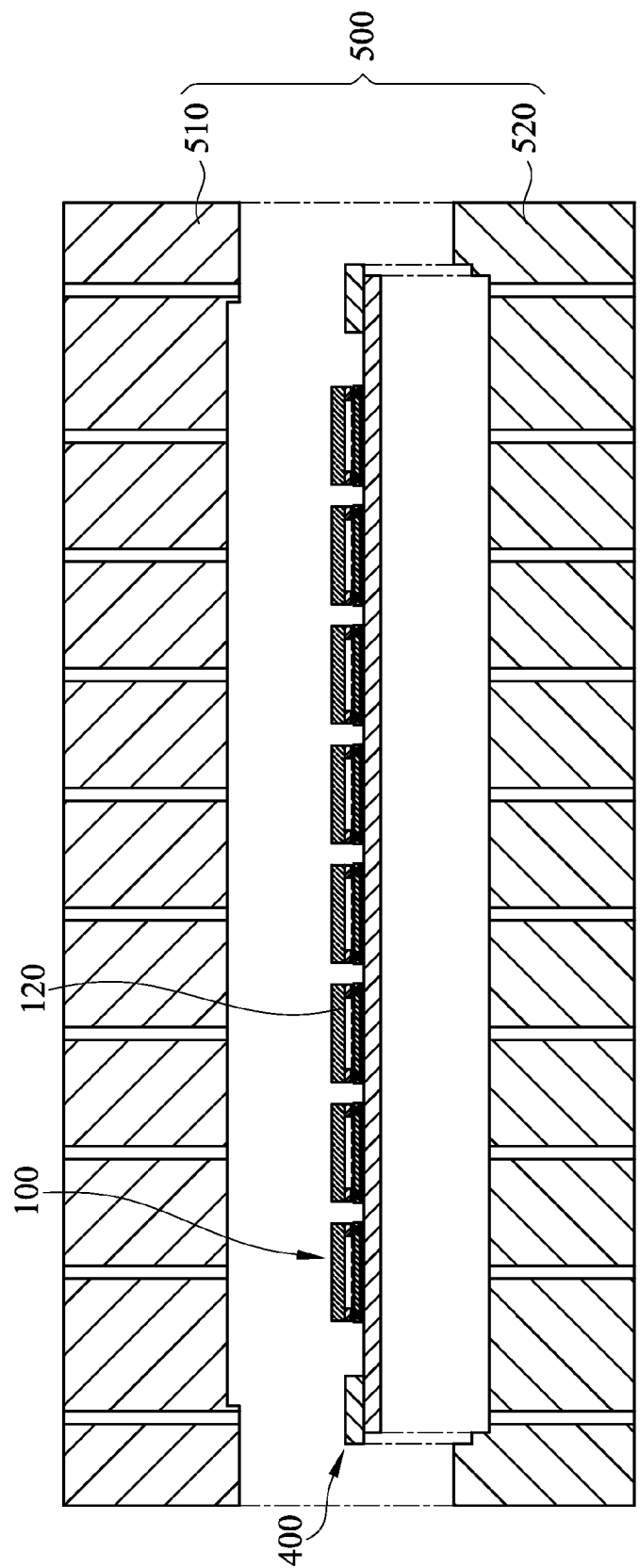
FIG. 14 is a schematic exploded view of the semi-finished products disposed in a die set according to an embodiment of the present invention.
Figure 15:
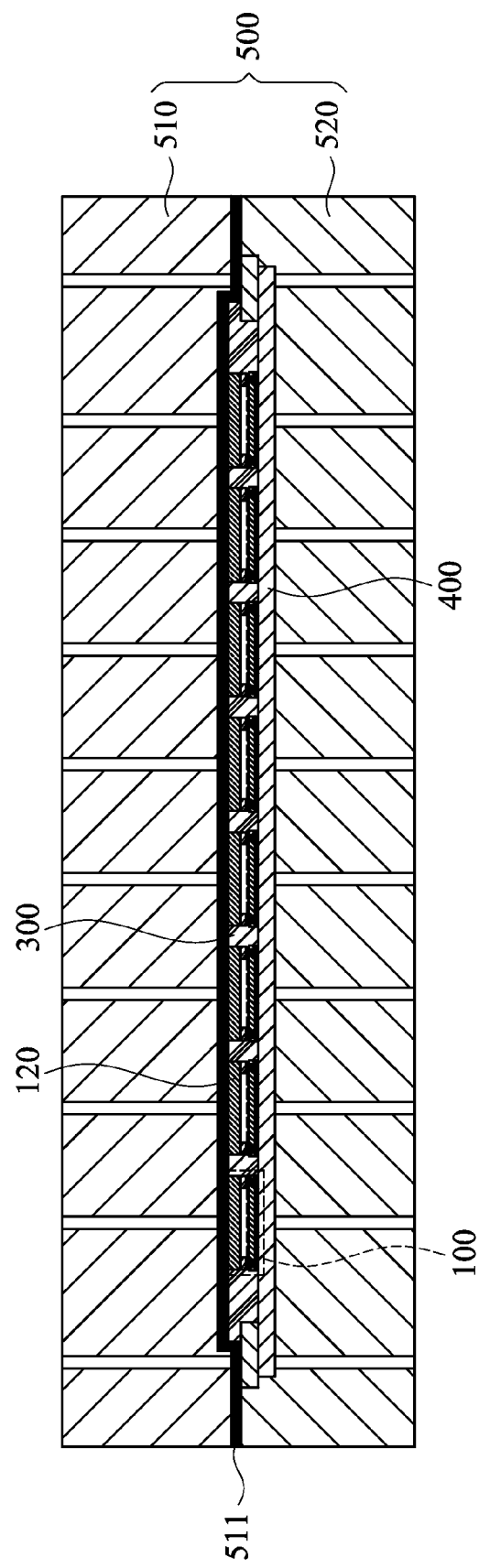
FIG. 15 is a schematic cross-sectional view of other semi-finished products disposed in the die set according to an embodiment of the present invention.
Figure 16:
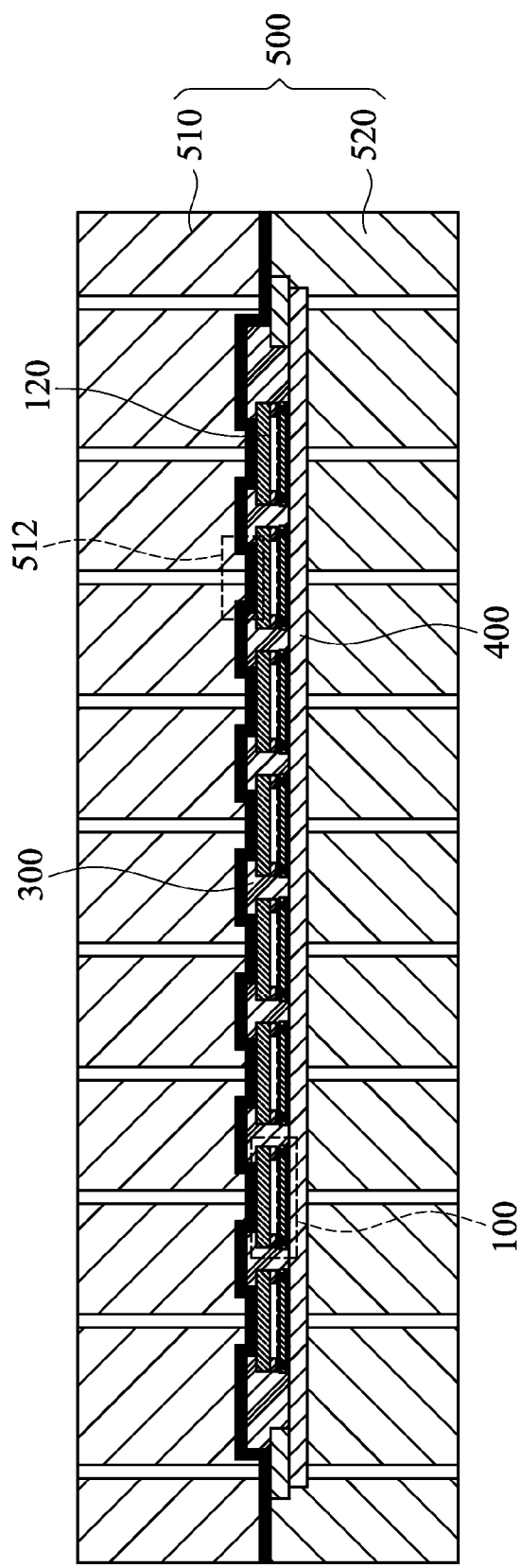
FIG. 16 is a schematic cross-sectional view of yet other semi-finished products disposed in the die set according to an embodiment of the present invention.

Referring to FIG. 13, there is shown a flow chart of a method of the molding-based packaging process according to an embodiment of the present invention. Referring to FIG. 14, there is shown a schematic exploded view of the semi-finished products 100 disposed in a die set 500 according to an embodiment of the present invention. Referring to FIG. 15, there is shown a schematic cross-sectional view of other semi-finished products 100 disposed in the die set 500 according to an embodiment of the present invention. Referring to FIG. 16, there is shown a schematic cross-sectional view of yet other semi-finished products 100 disposed in the die set 500 according to an embodiment of the present invention.

Figure 17A:
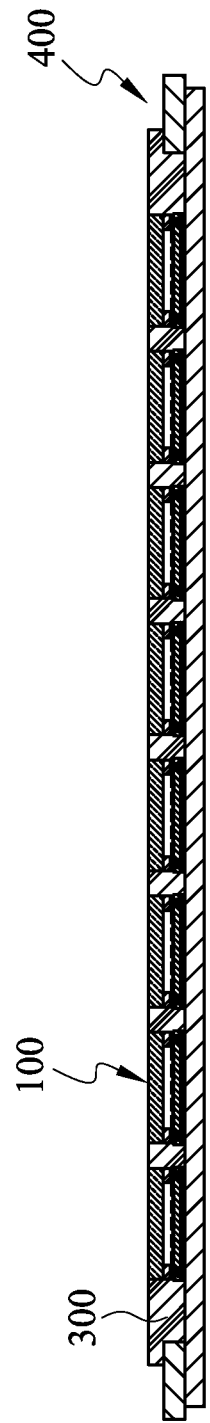
FIG. 17A is a schematic view of a structure after die opening shown in FIG. 15 according to an embodiment of the present invention.
Figure 17B:
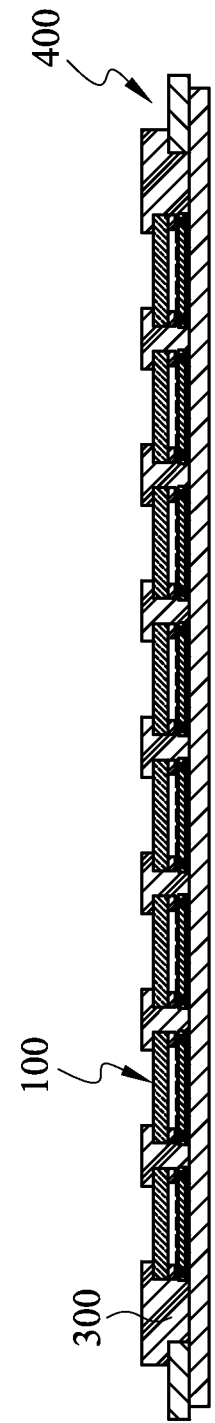
FIG. 17B is a schematic view of the structure after die opening shown in FIG. 16 according to an embodiment of the present invention.
Figure 18A:
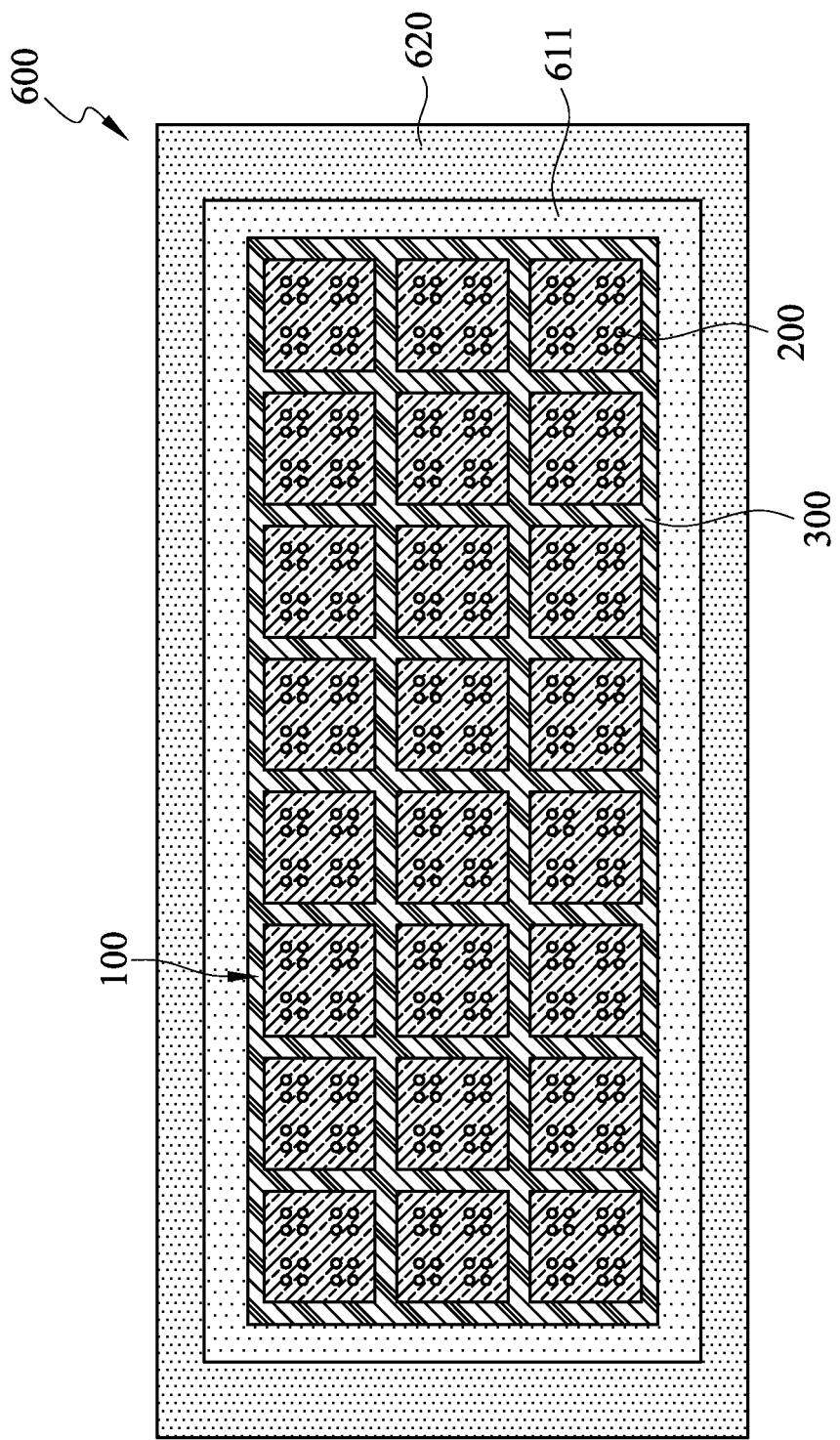
FIG. 18A is a schematic top view of solder ball-mounted semi-finished products according to an embodiment of the present invention.
Figure 18B:
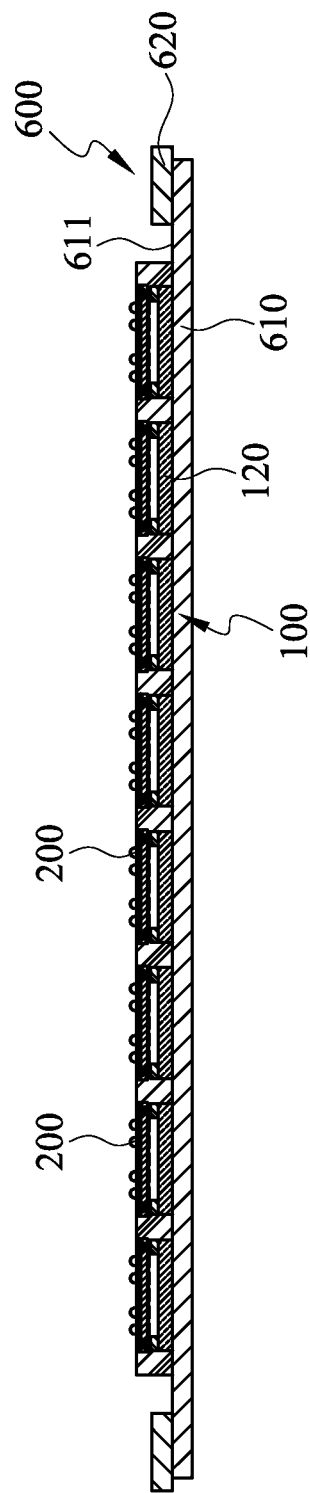
FIG. 18B is a schematic cross-sectional view of the solder ball-mounted semi-finished products showed in FIG. 18A according to an embodiment of the present invention.

Referring to FIG. 17A, there is shown a schematic view of a structure after die opening shown in FIG. 15 according to an embodiment of the present invention. Referring to FIG. 17B, there is shown a schematic view of the structure after die opening shown in FIG. 16 according to an embodiment of the present invention. Referring to FIG. 18A, there is shown a schematic top view of semi-finished products 100 having solder balls 200 mounted thereon according to an embodiment of the present invention. Referring to FIG. 18B, there is shown a schematic cross-sectional view of the solder ball-mounted semi-finished products 100 showed in FIG. 18A according to an embodiment of the present invention.

Referring to FIG. 13, the molding-based packaging process comprises the steps of: providing a first carrier (S521); providing a die set (S522); disposing inside a die set the first carrier having the semi-finished products thereon (S523); introducing the encapsulant into the die set (S524); performing pressure-holding and heating (S525); and performing a post-baking process (S526).

The step of providing a first carrier (S521) is described hereunder. Referring to FIG. 10A and FIG. 10B too, the semi-finished products 100 are arranged in an array within the first carrying region of the first carrier 400 and spaced apart from each other by a preset distance, and the semi-finished products 100 are temporarily adhered to the first adhesive side 411 by the soldering pad-disposed sides of the semi-finished products 100.

The step of providing a die set (S522) is described hereunder. Referring to FIG. 14, the die set 500 comprises an upper half and a lower half, that is, a first die 510 and a second die 520, respectively. Also, as shown in FIG. 15, the first die 510 can further comprise a vacuum adsorption buffer layer 511. The vacuum adsorption buffer layer 511 is disposed on the inner surface of the first die 510, wherein the inner surface of the first die 510 is a plane. Once the semi-finished products 100 are placed inside the die set 500 and the vacuum adsorption buffer layer 511 is subjected to vacuum adsorption, the vacuum adsorption buffer layer 511 will directly exert pressure upon the surfaces of the transparent lids 120 of the semi-finished products 100 and thereby prevent the surfaces of the transparent lids 120 from being contaminated due to the overflow of the encapsulant 300 fed in.

The step of disposing inside the die set the first carrier having the semi-finished products thereon (S523) is described hereunder. As shown in FIG. 14, the first carrier 400 with the semi-finished products 100 thereon is placed between the first die 510 and the second die 520 of the die set 500. The first die 510 abuts tightly against the surfaces of the transparent lids 120 of the semi-finished products 100 due to vacuum adsorption. The second die 520 abuts against one side of the first carrier 400. A mold cavity is formed between the die set 500 and the semi-finished products 100.

Referring to FIG. 15, in an embodiment where the vacuum adsorption buffer layer 511 is disposed on the inner surface of the first die 510, the vacuum adsorption buffer layer 511 can be tightly attached to the transparent lids 120 of the semi-finished products 100 due to vacuum adsorption, and thus the transparent lids 120 are not susceptible to contamination which might otherwise result from the overflow of the encapsulant 300 fed in.

Referring to FIG. 16, a plurality of flanges 512 is disposed on the first die 510 of the die set 500. The flanges 512 correspond in position to the semi-finished products 100, respectively, and abut against the transparent lids 120 on the semi-finished products 100. Each of the flanges 512 is of a smaller cross-sectional area than the area of an adjacent one of the transparent lids 120; hence, each of the flanges 512 of the first die 510 abuts against a portion of the adjacent one of the transparent lids 120.

The step of introducing the encapsulant into the die set (S524) is described hereunder. As shown in FIG. 15 and FIG. 16, the step of introducing the encapsulant into the die set entails introducing the encapsulant 300 into a mold cavity formed between the die set 500 and the semi-finished products 100. The encapsulant 300 is a mold compound. Once the mold cavity is filled with the encapsulant 300, the encapsulant 300 can cover the lateral sides of the semi-finished products 100. However, depending on the die set 500 in use, it is feasible to take any of the two options as follows: the encapsulant 300 does not cover the transparent lids 120 (as shown in FIG. 15); or the encapsulant 300 covers the lateral sides of the semi-finished products 100 and the periphery of the transparent lids 120, but the encapsulant 300 does not conceal the image sensing region 111 in principle (as shown in FIG. 16).

The step of performing pressure-holding and heating (S525) entails holding the pressure inside the die set 500, so as for the encapsulant 300 to transform and take shape.

The step of performing a post-baking process (S526) is described hereunder. As shown in FIG. 17A and FIG. 17B, after the encapsulant 300 has transformed and taken shape, die opening takes place, and then the encapsulant 300 is cured by the post-baking process to thereby finalize the molding process. Referring to FIG. 17A, there is shown is a schematic view of the semi-finished products 100 of the wafer level image sensor packaging structure fabricated upon completion of the die opening of the die set 500 shown in FIG. 15 and upon completion of the ensuing post-baking process. Referring to FIG. 17B, there is shown a schematic view of the die set 500 after die opening shown in FIG. 16 according to an embodiment of the present invention.

The step of mounting the solder balls (S600) is described hereunder. Before mounting the solder balls 200, it is necessary to remove from the first carrier 400 the semi-finished products 100 that have completely undergone the molding process, put the semi-finished products 100 on a second carrier 600 upside down, and expose the soldering pad-disposed sides of the semi-finished products 100. Referring to FIG. 18A and FIG. 18B, the second carrier 600 comprises a second film 610 and a second frame 620. The second film 610 has a second adhesive side 611. The second film 610 is attached to one side of the second frame 620, such that the second adhesive side 611 is exposed from inside the second frame 620 and forms a second carrying region. The transparent lids 120 of the semi-finished products 100 are adhesively attached to the second adhesive side 611.

Referring to FIG. 18A and FIG. 18B, the step of mounting solder balls entails mounting the solder balls 200 on the soldering pads 112, and the solder balls 200 disposed on the soldering pads 112 are arranged in the form of a ball grid array (BGA).

Figure 19A:
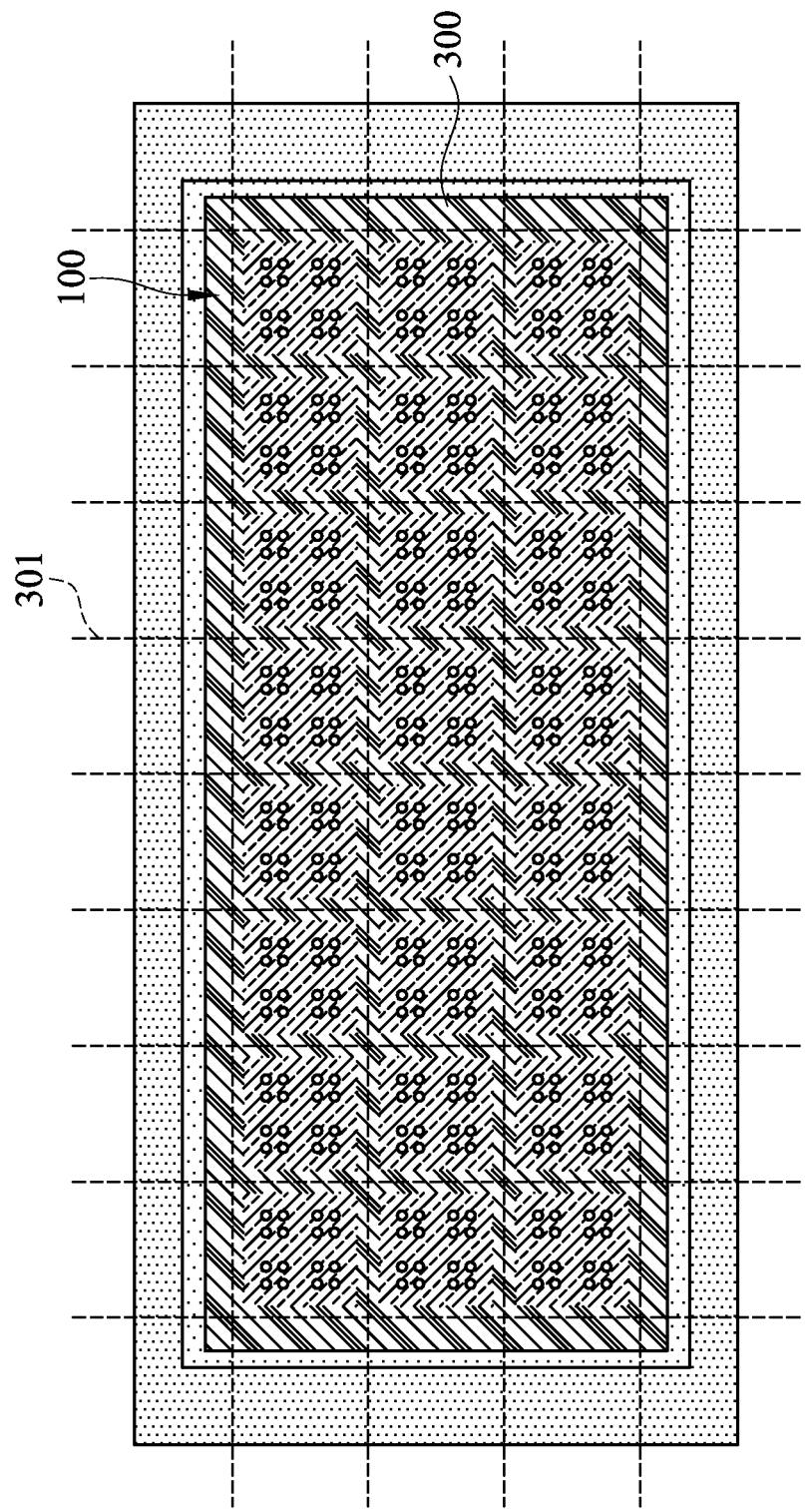
FIG. 19A is a schematic top view of the wafer level image sensor packaging structure according to an embodiment of the present invention.
Figure 19B:
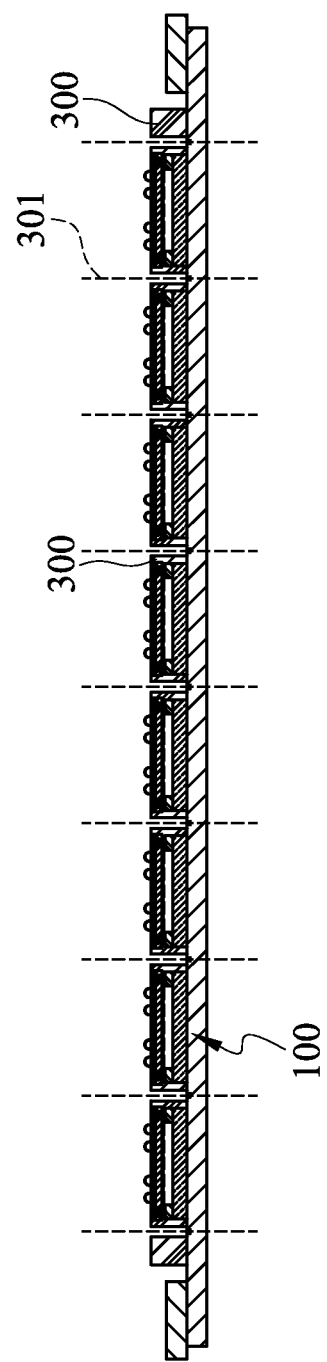
FIG. 19B is a schematic cross-sectional view of the wafer level image sensor packaging structure according to an embodiment of the present invention.
Figure 20A:
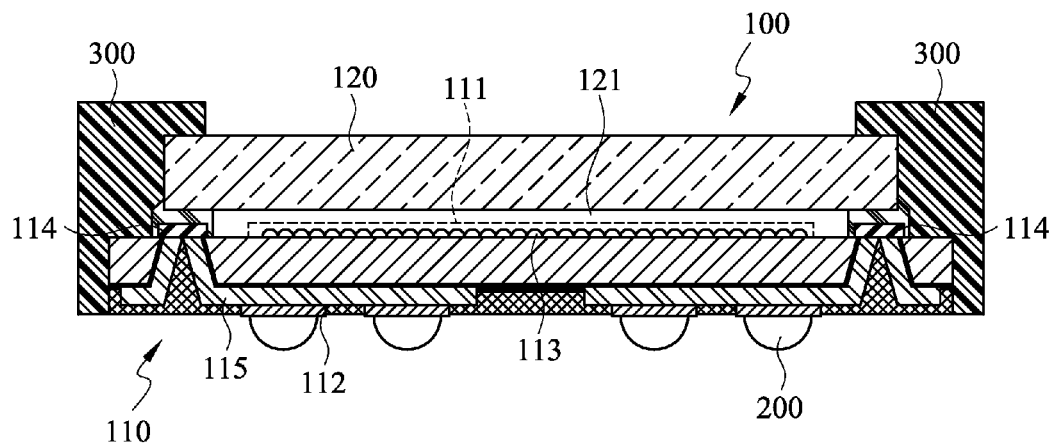
FIG. 20A and FIG. 20B are schematic views of the wafer level image sensor packaging structure according to an embodiment of the present invention.
Figure 20B:
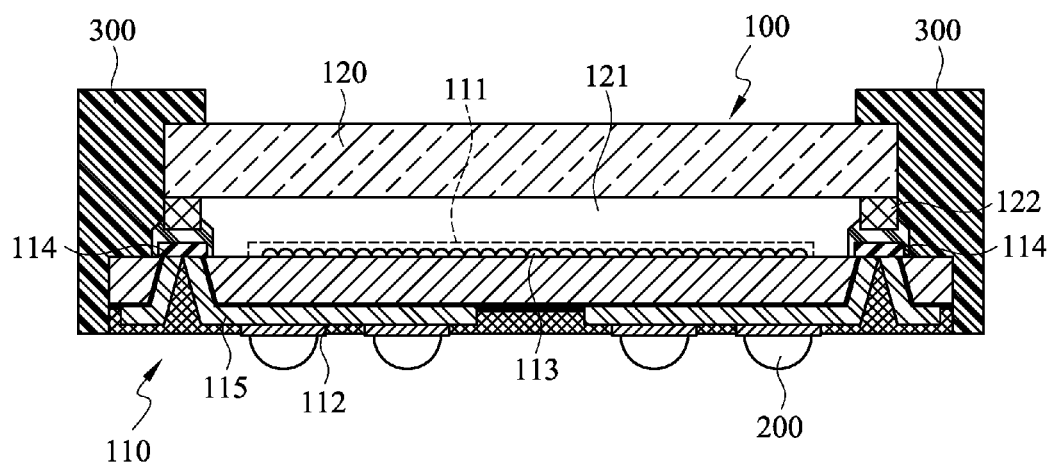

Referring to FIG. 19A, there is shown a schematic top view of the wafer level image sensor packaging structure according to an embodiment of the present invention. Referring to FIG. 19B, there is shown a schematic cross-sectional view of the wafer level image sensor packaging structure according to an embodiment of the present invention. Referring to FIG. 20A and FIG. 20B, there are shown schematic views of the wafer level image sensor packaging structure according to an embodiment of the present invention.

The step of cutting the encapsulant (S700) is described hereunder. As shown in FIG. 19A and FIG. 19B, the step of cutting the encapsulant 300 entails cutting the encapsulant 300 between the semi-finished products 100 along a cutting line 301, so as to obtain a plurality of wafer level image sensor packaging structures.

Referring to FIG. 1A and FIG. 1B, there are shown schematic views of the wafer level image sensor packaging structure obtained by the dispensing-based packaging process according to an embodiment of the present invention. Furthermore, the transparent lid 120 shown in FIG. 1A does not have the supporting frame 122 thereon, but the transparent lid 120 shown in FIG. 1B has the supporting frame 122 thereon. Referring to FIG. 2A, FIG. 2B, FIG. 20A, and FIG. 20B, there are shown schematic views of the wafer level image sensor packaging structure obtained by the molding-based packaging process. As shown in FIG. 2A and FIG. 2B, the wafer level image sensor packaging structure is fabricated by means of the die set 500 not having a plurality of flanges 512, and thus the encapsulant 300 disposed at ends of the packaging structure has a flat surface and does not cover the transparent lid 120. As shown in FIG. 20A and FIG. 20B, the plurality of flanges 512 are disposed on the first die 510 of the die set 500 of the wafer level image sensor packaging structure, and thus the encapsulant 300 covers the lateral sides of the wafer level image sensor packaging structure and the periphery of the transparent lid 120.

The aforesaid six aspects of implementation of the wafer level image sensor packaging structure have a characteristic in common, that is, the encapsulant 300 always extends to cover the image sensing chips 110, such that the image sensing chips 110 are free of cracking which might otherwise occur as a result of excessive thinness of the image sensing chips 110. Accordingly, the encapsulant 300 reinforces the wafer level image sensor packaging structure of the present invention.

The foregoing embodiments are provided to illustrate and disclose the technical features of the present invention so as to enable persons skilled in the art to understand the disclosure of the present invention and implement the present invention accordingly, and are not intended to be restrictive of the scope of the present invention. Hence, all equivalent modifications and variations made to the foregoing embodiments without departing from the spirit embodied in the disclosure of the present invention should fall within the scope of the present invention as set forth in the appended claims.

What is claimed is:

1. A wafer level image sensor packaging structure manufacturing method, comprising the steps of:
   providing a silicon wafer comprising a plurality of image sensing chips, the image sensing chips each comprising an image sensing region and a plurality of soldering pads;
   dicing the silicon wafer such that the silicon wafer is divided into the image sensing chips;
   providing a plurality of transparent lids by cutting at least one transparent panel;
   fabricating a plurality of semi-finished products each having the transparent lid correspondingly disposed above the image sensing region of the image sensing chip, wherein a air cavity is formed between the transparent lid and the image sensing region;

performing a packaging process by filling an encapsulant between the semi-finished products such that the encapsulant only covers lateral sides of each of the semi-finished products;
mounting solder balls on the soldering pads; and
cutting the encapsulant between the semi-finished products.

2. The wafer level image sensor packaging structure manufacturing method of claim 1, wherein the packaging process comprises the steps of:
providing a first carrier by disposing the semi-finished products on the first carrier, wherein the first carrier comprises a first film and a first frame, the first film having a first adhesive side and being attached to a side of the first frame, such that the first adhesive side is exposed from inside the first frame to form first carrying region;
disposing a dam, wherein the dam is disposed on the first carrier and configured to enclose the semi-finished products;
introducing the encapsulant, wherein the encapsulant is a liquid compound; and
performing baking and curing on the encapsulant, so as for the encapsulant to take shape.

3. The wafer level image sensor packaging structure manufacturing method of claim 2, wherein the semi-finished products are arranged in an array within the first carrying region, and the soldering pads of the semi-finished products rest on the first adhesive side, wherein the soldering pads and the image sensing region are disposed on opposing surfaces of the image sensing chip.

4. The wafer level image sensor packaging structure manufacturing method of claim 3, wherein the step of mounting the solder balls further comprises the sub-steps of: putting on a second carrier the semi-finished products having completely undergone the packaging process; and exposing the soldering pad-disposed sides of the semi-finished products, wherein the solder balls disposed on the soldering pads are arranged in form of a ball grid array (BGA).

5. The wafer level image sensor packaging structure manufacturing method of claim 4, wherein the second carrier comprises a second film and a second frame, the second film having a second adhesive side and being attached to a side of the second frame, such that the second adhesive side is exposed from inside the second frame and forms a second carrying region, and the transparent lids of the semi-finished products are adhesively attached to the second adhesive side.

6. The wafer level image sensor packaging structure manufacturing method of claim 5, wherein a gridded frame is formed on the transparent panel, and the gridded frame is cut and divided into the transparent lids, wherein, after being cut, the gridded frame turns into a supporting frame on a corresponding one of the transparent lids, wherein the gridded frame is fabricated by one of screen printing, transfer molding, and injection molding, and is made of an epoxy.

7. The wafer level image sensor packaging structure manufacturing method of claim 6, further comprising the steps of: coating an adhesive along a periphery of the image sensing region; aligning the supporting frame with the adhesive and adhesively attaching the supporting frame to the adhesive, such that the supporting frame adheres to the image sensing chip and surrounds the image sensing region; and baking or UV-radiation curing the adhesive.

8. The wafer level image sensor packaging structure manufacturing method of claim 7, wherein the silicon wafer is a through-silicon vias (TSV) wafer.

9. The wafer level image sensor packaging structure manufacturing method of claim 1, wherein the packaging process comprises the steps of:
providing a first carrier for carrying the semi-finished products, wherein the first carrier comprises a first film and a first frame, the first film having a first adhesive side and being attached to a side of the first frame, such that the first adhesive side is exposed from inside the first frame to form first carrying region;
providing a die set comprising a first die and a second die, wherein the first die further comprises a vacuum adsorption buffer layer;
disposing between the first die and the second die the first carrier having the semi-finished products thereon, the first die abutting against the transparent lids of the semi-finished products, and the second die abutting against a side of the first carrier;
introducing the encapsulant into the die set, so as for the encapsulant to only cover lateral sides of the semi-finished products, wherein the encapsulant is a mold compound;
performing pressure-holding and heating, so as for the encapsulant to take shape; and
performing a post-baking process for curing the encapsulant.

10. The wafer level image sensor packaging structure manufacturing method of claim 9, wherein a plurality of flanges are disposed on the first die, correspond in position to the semi-finished products, respectively, abut against the transparent lids on the semi-finished products, respectively, and are each of a smaller cross-sectional area than an area of an adjacent one of the transparent lids.

11. The wafer level image sensor packaging structure manufacturing method of claim 10, wherein the semi-finished products are arranged in an array within the first carrying region, and the soldering pads of the semi-finished products rest on the first adhesive side, wherein the soldering pads and the image sensing region are disposed on opposing surfaces of the image sensing chip.

12. The wafer level image sensor packaging structure manufacturing method of claim 11, wherein the step of mounting the solder balls further comprises the sub-steps of: putting on a second carrier the semi-finished products having completely undergone the packaging process; and exposing the soldering pad-disposed sides of the semi-finished products, wherein the solder balls disposed on the soldering pads are arranged in form of a ball grid array (BGA).

13. The wafer level image sensor packaging structure manufacturing method of claim 12, wherein the second carrier comprises a second film and a second frame, the second film having a second adhesive side and being attached to a side of the second frame, such that the second adhesive side is exposed from inside the second frame and forms a second carrying region, and the transparent lids of the semi-finished products are adhesively attached to the second adhesive side.

14. The wafer level image sensor packaging structure manufacturing method of claim 13, wherein a gridded frame is formed on the transparent panel, and the gridded frame is cut and divided into the transparent lids, wherein, after being cut, the gridded frame turns into a supporting frame on a corresponding one of the transparent lids, wherein the gridded frame is fabricated by one of screen printing, transfer molding, and injection molding, and is made of an epoxy.

15. The wafer level image sensor packaging structure manufacturing method of claim 14, further comprising the steps of: coating an adhesive along a periphery of the image sensing region; aligning the supporting frame with the adhesive and adhesively attaching the supporting frame to the adhesive, such that the supporting frame adheres to the image sensing chip and surrounds the image sensing region; and baking or UV-radiation curing the adhesive.

16. The wafer level image sensor packaging structure manufacturing method of claim 15, wherein the silicon wafer is a through-silicon vias (TSV) wafer.

* * * * *